United States Patent

Ohmi et al.

[11] Patent Number: 5,530,283
[45] Date of Patent: Jun. 25, 1996

[54] LEAD FRAME AND LEAD FRAME MATERIAL

[75] Inventors: Tadahiro Ohmi, 1-17-301, Komegabukuro 2-chome, Aoba-ku,, Miyagi-ken 980; Nobukazu Ikeda, Osaka; Michio Yamaji, Osaka; Tsutomu Shinohara, Osaka; Akihiro Morimoto, Osaka; Yasuyuki Shirai, Osaka, all of Japan

[73] Assignees: Tadahiro Ohmi, Miyagi-Ken; Fujikin Inc., Osaku-Fu, both of Japan

[21] Appl. No.: 518,529

[22] Filed: Aug. 23, 1995

[30] Foreign Application Priority Data

Aug. 29, 1994 [JP] Japan .................. 6-204038

[51] Int. Cl.$^6$ .................. H01L 23/495
[52] U.S. Cl. .................. 257/677; 257/666
[58] Field of Search .................. 257/666, 677

[56] References Cited

U.S. PATENT DOCUMENTS 4,883,774  11/1989  Djennas et al. .................. 257/677
4,903,401  2/1990  Webb .................. 257/677

Primary Examiner—Sara W. Crane
Assistant Examiner—S. V. Clark
Attorney, Agent, or Firm—Marshall, O'Toole, Gerstein, Murray & Borun

[57] ABSTRACT

An object of the present invention is to provide a lead frame and a material for lead frame which insure excellent bonding and enables substantial reduction of time for production because such processes as plating are not required and furthermore are excellent in abration resistance.

The present invention is characterized in that a silver layer having a construction where amplitude of a refracted ray refracted on the (200) surface is ⅓ or more of the amplitude of refracted X ray refracted on the (111) surface comprises an outer lead section of the base material for the lead frame. The base material is preferably copper, copper-alloy, iron, or iron alloy. The silver layer is formed, for instance, by means of silver plating, and the thickness is preferably in a range from 8 m to 30 m. An intermediate layer may be provided between a surface of the base material and the silver layer.

6 Claims, No Drawings

LEAD FRAME AND LEAD FRAME MATERIAL

TECHNICAL FIELD

The present invention relates to a lead frame and lead frame materials.

BACKGROUND ART

A lead frame is manufactured by stamping a plate-formed lead frame material made of copper, iron, or alloy containing one of these metals as a main component (such as Fe—Ni alloy) into a specified form, and generally comprises a die bonding section, an inner lead section, and an outer lead section.

A semiconductor chip is die-bonded to a die bonding section of a lead frame, for instance, by means of the Au-Si autectic method, by bonding with Ag paste or the line, or by bonding with soldering, a lead section (an electrode section) and an inner lead section of the semiconductor chip are wire-bonded using Au or Al wire, then molding is carried out by shielding with resin (or ceramics) leaving the outer lead section, thus a mold pack semiconductor device being manufactured.

A mold pack semiconductor device is mounted on an electronic board for use by bending an outer lead section thereof and inserting the bent outer lead section into the electronic board or the like.

By the way, adhesion between a semiconductor chip and a die bonding section or adhesion between an inner lead section and wire is an important problem. If the adhesion is poor, the wire may be peeled off during use of the mold pack semiconductor device, which may cause disconnection and give damages to reliability of the semiconductor device. Also in the molding process, the wire may be pealed off due to a pressure for shielding, which in turn may lower the yield.

To improve the adhesion, sometimes silver-plating is carried out to a portion of or the entire surface of the lead frame (especially a die bonding section and an inner lead section each subjected to bonding).

However, in a case where silver plating is executed to the entire surface of a lead frame, there occurs a problem that change of color is generated in a surface of the silver plating surface due to heating under a high temperature in a range from 200° to 450° C. in the processes of, for instance, die bonding, wire bonding, or shielding with resin. In recent years, various efforts have been performed for trying to prevent the color change due to heating under a high temperature by lowering the required temperature in the processes as described above, but the result is not adequate yet, and even if it is possible to prevent color change in the above-described processes, there still remains a problem that color change occurs in portions other than a section shielded with resin (i.e. an outer lead section) during storage thereof in the atmospheric air for several day. When this kind of color change is generated in the outer lead section, there occurs also a problem that variation in electric contact resistance between the outer lead section and a section in the electronic board into which the outer lead section is inserted is generated.

To solve the problem due to color change as described above, silver plating in the outer lead section is pealed off after molding has been finished, and then normally surface processing such as alloy plating or soldering plating in which tinning or tin is a standard composition is subjected thereto. It should be noted that, herein the reason why tinning is subjected to the outer lead section after silver plating has been pealed off once without coating tinning over the silver-plated layer is because, if silver plating layer is coated by tinning or the like, there occurs a problem that silver and tin are alloyed in association with elapse of time, which makes the outer lead section much brittle and gives damages to reliability of the mold pack semiconductor device.

However in the technology described above, process for pealing off a silver plating and process for surfaces to be subjected to tinning are required, and at least two days are required for those processes. In addition thereto, when hardness of tin or tin alloy is low and the outer lead section is repeatedly set to or taken off from the electronic board of the mold pack semiconductor device, there occurs also a problem that the outer lead section is easily worn out and variation in electric contact resistance is easily generated. It is an object of the present invention to provide a lead frame and a lead frame material which are possible to reduce largely required a number of days for manufacturing as compared to the conventional type thereof because bonding is under good conditions and processes such as tinning or the like are not required, and furthermore has high abrasion resistance.

DISCLOSURE OF THE INVENTION

A first main point of the present invention to solve the problems described above is present at a lead frame characterized in that a silver layer having a crystal structure, in which intensity of a diffraction ray diffracted on a (200) surface is ⅓ or more of that of a diffraction X ray diffracted on a (111) surface, is formed at least in an outer lead section of a base material of the lead frame.

Also a second main point thereof is present at a lead frame material characterized in that a silver layer having a crystal structure, in which intensity of a diffraction ray diffracted on a (200) surface is ⅓ or more of that of a diffraction X ray diffracted on a (111) surface, is formed on a surface of a base material of a lead frame.

FUNCTION

Description is made hereinafter for effects of the present invention by explaining how the present invention has been made and what sort of impression has been obtained from the process thereof.

The present inventor has found that color change resistance is related to a crystal structure of a silver layer after great efforts have been made to find a method for preventing generation of color change.

It should be noted that, it has not been known concretely in what type of crystal structure color change resistance works even if color change resistance was known to be related to a crystal structure of a silver layer. Then, as a result of further experiments, it has been determined that color change resistance is closely related to a surface index as a crystal structure. And further studies of defining conditions under which it works show that excellent color change resistance is performed when a silver layer has a crystal structure in which intensity of diffraction ray diffracted on a (200) surface is more than ⅓ or more of that of diffraction X ray diffracted on a (111) surface, which has been led to the present invention.

Namely the silver layer described above has been found to be characterized in that color change does not occur even if a silver layer passes the process under a high temperature up to shielding with resin or even if it has been left in an atmospheric air for a long period of time.

The inventor has had an idea that a considerably advantageous lead frame must be obtained by utilizing the characteristics thereof described above.

However, the silver layer described above can not be used as a surface layer of a lead frame if it is excellent only at color change resistance, and for this reason, in addition to color change resistance thereof, other characteristics required in a case where the silver layer is to be used as a surface layer of a lead frame have been studied.

As a result of the studies, it has been found that the silver layer described above has more excellent characteristics in its adhesion, electric conductivity, and bonding characteristics as compared to the conventional type thereof.

Furthermore, it has also been found that the silver layer according to the present invention has also excellent abrasion resistance.

As described above, in the silver layer of the present invention, different from the conventional type thereof, it is not required that a silver layer has to be peeled off after molding and then a plating layer with tin or the like is formed thereon because the silver layer has excellent color change resistance, so that reduction in processes as well as a number of days for manufacture thereof can be achieved.

The formation of a silver layer having the characteristics described above is achieved by, for instance, executing a heat processing under a specified temperature for a specified period of time. Temperature and a period of time required for the processing in a case where a silver layer is formed by plating are different depending on current density, a temperature for a plating bath, a composition for plating bath, whether a brightener is used or not, and purity of electrode, so that a temperature and a period of time required according to conditions for each plating may be obtained previously from experiments or the like.

It should be noted that the silver surface layer may be formed not only on a surface as a bonding surface but also on the rear surface thereof.

A silver surface layer is most preferable to be formed in a stage of lead frame material. Namely it is preferable that the formation thereof is executed before stamping. However, the silver surface layer described above hardly changes in its adhesion capability even when stamping is executed in the state of silver surface layer being formed.

BEST MODE FOR CARRYING OUT THE INVENTION (Embodiment 1)

In the present embodiment, the lead frame was manufactured by preparing a lead frame plate material containing a copper alloy, and forming a die bonding section, an inner lead section, and an outer lead section according to stamping the plate described above under low temperature.

Then the entire surface of lead frame was subjected to silver plating under the following conditions:
Composition in a plating bath
  Silver cyanide 4.0 g/l
  Potassium cyanide 80 g/l
  Brightener a small amount
Temperature for plating
  25° C.
Current density
  1.3 A/dm$^2$
Voltage for a plating bath
  4.2 V With this configuration, a silver-plated layer with a thickness of 20 μm was formed thereon.

Then a heat processing under the condition of 550° C.×6 hours was executed thereto.

Then a mold pack semiconductor device was manufactured by executing a die bonding with soldering and a wire-bonding, and by shielding with resin under a temperature of 400° C.

(Conventional Example 1)

In the present example, a mold pack semiconductor device was manufactured by executing bonding and shielding with resin without executing a heat processing in which the same plating as that in Embodiment 1 was executed.

(Comparative Example 1)

In the present example, a heat processing under conditions of 200° C.×6 hours was executed in place of the heat processing in Embodiment 1.

Other points of the conditions are the same as those in Embodiment 1.

The following tests on the lead frame manufactured as described above were performed during the precesses for its manufacturing and after its manufacturing.
X ray diffraction on the silver-plated layer Tests on X ray diffraction on the silver-plated layer and adhesion thereof were performed in each state thereof after subjected to silver plating and also after subjected to a heat processing thereafter.

Intensity of silver plating itself, namely intensity of X ray diffracted on a (200) surface in the example of conventional type 1 was 5 assuming that the intensity of X ray diffraction diffracted on a (111) surface was set to 100.

As a result of testing on X ray diffraction on the silver-plated layer in Embodiment 1, it has been found that intensity of X ray diffracted on a (200) surface was 68 assuming the intensity of diffraction X ray diffracted on a (111) surface was set to 100.

On the other hand, as a result of testing on X ray diffraction on the silver-plated layer after subjected to heat processing thereto in Comparative Example 1, intensity of X ray diffracted on a (200) surface was 24 assuming the intensity of diffraction X ray diffracted on a (111) surface was set to 100.
Adhesion test of a plating layer The adhesion of the plating layer was tested with a cross-cut adhesion test and was evaluated by counting a number of peel thereof.

A number of peel on a silver-plated layer is 0.8 in Comparative Example 1, while in Embodiment 1 it is 0.3 assuming that a number of peel in Conventional Example 1 is set to the reference 1, and for this reason it has been found that Embodiment 1 has an excellent adhesion capability.
Adhesion test of bonding The adhesion capability thereof was evaluated by providing tension on a wire bonding to study a rupture of the wire-bonding.

In Conventional Example 1 and Comparative Example 1, there has sometimes occurred a rupture in the bonding section, while in Embodiment 1, a rapture occurs almost in the wire section, which shows that Embodiment 1 is also excellent at bonding characteristics, Color change resistance test As a result of making visual observation of color change in an outer lead section after subjected to shielding with resin, color change was recognized in Conventional Example 1 and Comparative Example 1, while it was not recognized in Embodiment 1.

Also, in Embodiment 1, changes in association with elapse of time concerning color change in the outer lead section was observed when the outer lead section was left in an atmospheric air, but color change was not recognized even after one month had passed. It should be noted that the observation thereof was stopped at that point of time.

Inserting and detaching test

The outer lead section of the mold pack semiconductor device was repeated for 5,000 times to be inserted into and to be detached from an entry of the electronic board, and changes in contact resistance before starting the test and after detaching therefrom for 5,000 times was studied, and as a result thereof, change was hardly found in Embodiment 1.

In contrast, it was recognized that contact resistance was reduced by 40% in Conventional Example 1, and by 20% in Comparative Example 1.

It should be noted that, in a case where conditions for plating were shown in Embodiment 1, intensity of the diffraction ray diffracted on a (200) surface is ⅓ or more of that of the diffraction X ray diffracted on a (111) surface by executing a heat processing thereto under the condition of 400 to 550° C.×2 to 7 hours, and the same excellent characteristics as those in Embodiment 1 were shown in any of the conditions described above.

(Embodiment 2)

In the present embodiment, a lead frame was subjected to silver plating at the state before stamping was executed, heat processing thereto was executed, and stamping was executed after subjected to heat processing.

Other conditions were set to those in Embodiment 1.

Generation of peel or burr from the silver-plated layer was observed after stamping, but peeling due to stamping was not found to be generate and a degree of generation of burr therefrom was less than that in Embodiment 1.

Also other characteristics were found to be similar to those in Embodiment 1.

(Embodiment 3)

In the present embodiment, a lead frame was subjected to silver plating under the following conditions by using a plate material for a lead frame containing a Fe-Ni alloy.

Composition in a plating bath
  Silver cyanide 2.0 g/l
  Copper cyanide 11.5 g/l
  Potassium cyanide 75 g/l
  Brightener a small amount
Temperature for plating
  26° C.
Current density
  2.0 A/dm$^2$
Voltage for a plating bath
  6 V With this configuration, a silver-plated layer with a thickness of 20 μm was formed thereon.

In the present embodiment, a heat processing thereto under the condition of 550° C.×7 hours was executed in an atmosphere of inert gas.

Intensity of a diffraction ray diffracted on a (200) surface was 69 assuming intensity of a diffraction X ray diffracted on a (111) surface was set to 100.

As a result of the same test as that in Embodiment 1 performed for evaluation thereof, as excellent a result as that in Embodiment 1 was obtained in all of the characteristics thereof.

(Embodiment 4)

In the present embodiment, how a thickness of the silver-plated layer was supposed to affect a lead frame was studied.

To obtain an accurate result, mold pack semiconductor devices were made each under such conditions that a thickness of a silver-plated layer thereon was changed each by each at 8 μm, 10 μm, 20 μm, 30 μm, and 40 μm, and other conditions were kept the same as those in Embodiment 1.

As a result of that, intensity of the diffraction ray diffracted on a (200) surface was found no change at any thickness thereof assuming that intensity of a diffraction X ray diffracted on a (111) surface was set to 100.

Also, as for the tests for color change resistance and for detaching the outer lead section from the entry of the electronic board, an effect of a thickness of the silver-plated layer thereover was not recognized.

As for adhesion of a wire-bonding, it was recognized that the thicker of a thickness of the silver-plated layer, the better result was gained. It should be noted that, in a case of a thickness of 8 μm, the result thereof was better than those of Conventional Example and Comparative Example, but much worse than that in a case of a thickness of 10 μm, and the adhesion thereof was remarkably improved with a thickness of around 10 μm or more. For this reason, a thickness of a silver-plated layer is preferably 10 μm or more. On the other hand, improvement of adhesion of the wire bonding was saturated with a thickness of around 30 μm. For this reason, a thickness thereof is preferably 30 μm or less from the economical point of view.

(Embodiment 5)

In the present embodiment, a lead frame was subjected to Ni plating as a substrate layer under the silver-plated layer.

Other points of the conditions were set to the same as those in Embodiment 1.

Industrial Applicability

With the present invention, the following effects will be achieved.

Therein bonding characteristics and adhesion of the plated layer work under good conditions, and for this reason a mold pack semiconductor device with high reliability can be provided.

As processes for tinning or the like are not required, a number of days required for manufacture thereof can largely be reduced as compared to the conventional type thereof, and reduction of the manufacturing cost can also be achieved.

There is no variation in contact resistance between the outer lead section and a section in the electronic board into which the outer lead section is inserted even if detaching therebetween is repeated, and for this reason an electronic board with high reliability can be provided.

We claim:

1. A lead frame, wherein a silver layer having a crystal structure, in which intensity of a diffraction ray diffracted on a (200) surface is ⅓ or more of that of a diffraction X ray diffracted on a (111) surface, is formed at least in an outer lead section of a base material of the lead frame.

2. A lead frame according to claim 1, wherein a base material of said lead frame is made from copper or copper alloy as well from iron or iron alloy.

3. A lead frame according to claim 1, wherein said silver layer is formed by plating.

4. A lead frame according to claim 1, wherein a thickness of said silver surface layer is in a range from 8 µm to 30 µm.

5. A lead frame according to claim 1, wherein an intermediate layer is provided between a surface of a base material for said lead frame and said silver layer.

6. A lead frame material, wherein a silver frame having a crystal structure, in which intensity of a diffraction ray diffracted on a (200) surface is ⅓ or more of that of a diffraction ray diffracted on a (111) surface.

* * * * *